US006809252B2

(12) United States Patent
Winkeler

(10) Patent No.: US 6,809,252 B2
(45) Date of Patent: Oct. 26, 2004

(54) SOLAR CELL UNIT WITH REMOVABLE LAYER

(75) Inventor: Jan Winkeler, Te Zevenaar (NL)

(73) Assignee: Akzo Nobel N.V., Arnhem (NL)

( * ) Notice: Subject to any disclaimer, the term of this patent is extended or adjusted under 35 U.S.C. 154(b) by 0 days.

(21) Appl. No.: 10/297,854
(22) PCT Filed: May 31, 2001
(86) PCT No.: PCT/EP01/06299
§ 371 (c)(1), (2), (4) Date: Apr. 9, 2003
(87) PCT Pub. No.: WO01/97255
PCT Pub. Date: Dec. 20, 2001

(65) Prior Publication Data
US 2003/0150484 A1 Aug. 14, 2003

(30) Foreign Application Priority Data
Jun. 15, 2000 (NL) .............................................. 1015449

(51) Int. Cl.$^7$ .......................................... H01L 31/048
(52) U.S. Cl. ....................... 136/251; 136/256; 136/244; 136/291; 257/433; 134/10; 134/1; 134/42
(58) Field of Search ................................ 136/251, 256, 136/244, 291; 257/433; 134/10, 1, 42

(56) References Cited

U.S. PATENT DOCUMENTS

| 4,149,902 A | * | 4/1979 | Mauer et al. | 136/247 |
| 5,508,205 A | | 4/1996 | Dominguez et al. | 438/67 |
| 5,660,646 A | | 8/1997 | Kataoka et al. | 136/251 |
| 6,160,215 A | * | 12/2000 | Curtin | 136/244 |
| 6,294,724 B1 | * | 9/2001 | Sasaoka et al. | 136/251 |
| 6,380,477 B1 | * | 4/2002 | Curtin | 136/244 |
| 2004/0003840 A1 | * | 1/2004 | Umemoto | 136/251 |

FOREIGN PATENT DOCUMENTS

| EP | 886324 A1 | * | 12/1998 | |
| EP | 948004 | | 10/1999 | ............. H01G/9/00 |
| WO | 98/13882 | | 4/1998 | ....... H01L/31/0392 |
| WO | 99/49483 | | 9/1999 | ............. H01G/9/00 |

OTHER PUBLICATIONS

Hu et al, Solar Cells from Basic to Advanced Systems, McGraw–Hill, New York (1983), p. 70.*
EPO Patent Abstract of JP 59013380 (1984).
EPO Patent Abstract of JP 08236794 (1996).

* cited by examiner

Primary Examiner—Alan Diamond
(74) Attorney, Agent, or Firm—Richard P. Fennelly

(57) ABSTRACT

The invention pertains to a solar cell unit comprising a back electrode, a photovoltaic layer, a front electrode, and a transparent top layer, characterized in that on top of the top layer at least one removable transparent polymer film is present. Preferably, two to ten, more preferably three to five, removable transparent polymer films stacked one on top of the other are present on the top layer. On the bottom side the transparent polymer films may be provided with an adhesive layer that displays greater adhesion to the polymer film itself than to the underlying layer. Preferably, the solar cell unit is also provided with a substrate at the back of the back electrode. The presence of a transparent removable top layer enables easy removal of a surface once it has got dirty.

8 Claims, 1 Drawing Sheet

SOLAR CELL UNIT WITH REMOVABLE LAYER

Figure 1:
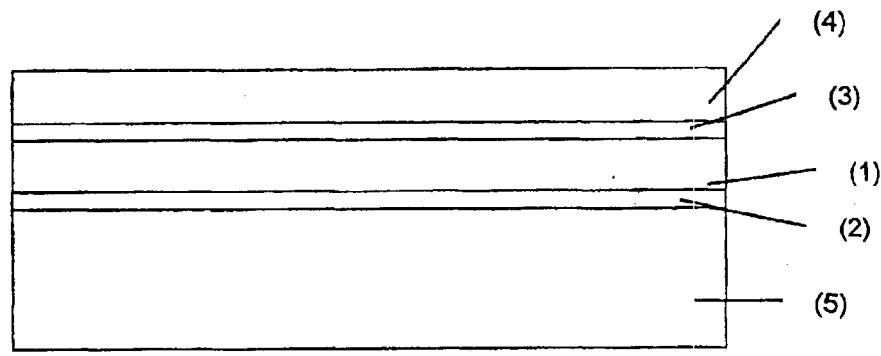

The present application is a national phase filing of PCT International Patent Application No. PCT/EP01/06299, filed May 31, 2001 and claims priority from Dutch Patent Application No. 1015449, filed on Jun. 15, 2000.

The invention pertains to a solar cell unit with a removable top layer.

Solar cell units as a rule comprise a photovoltaic (PV) layer composed of a semiconductor material which is provided between a front electrode (at the front of the unit, i.e. on the side of the incident light) and a back electrode (at the back of the unit). The front electrode is transparent, enabling incident light to reach the semiconductor material, where the incident radiation is converted into electric energy. In this way light can be used to generate electric power, which offers an interesting alternative to, say, fossil fuels or nuclear power.

The top side of the solar cell unit, i.e. the side of the front electrode, is protected from the effects of its surroundings by a transparent top layer which comprises, e.g., sheet of glass or a plastics based sheet or layer. When the solar cell unit is in use, its top layer will in due course get dirty, for instance because of soot, sand, and other dirt from the surrounding area being deposited thereon. As a result the transparency of the top layer will decrease, causing a reduction in the yield of the solar cell unit. When the top layer is made of glass, it can be cleaned in principle, but this is a labour intensive process, not least because solar cell units are often to be found on roofs or in otherwise poorly accessible places. Plastics based top layers generally are more fragile than top layers based on a glass sheet. This means that, on the one hand, the risk of damage to the top layer from its surroundings, e.g., because of sand, is greater still, while, on the other hand, cleaning of the top layer is even more problematic. In other applications, such as portable applications into which solar cells have been integrated, it is conceivable that in due course the outer surface will be damaged by contact or will acquire a less attractive appearance in some other way. The result of said effects is that it may be the top layer which in the end determines the life span of the solar cell unit, even though, generally speaking, it is not the most expensive part of solar cell unit.

For that reason there is need for a system with which labour intensive cleaning of the solar cell unit can be avoided and, more particularly in the case of plastics based top layers, the life span of the solar cell unit can be extended.

The present invention has for its object to resolve these problems and to this end provides a solar cell unit comprising a back electrode, a photovoltaic layer, a front electrode, and a transparent top layer, characterised in that on top of the top layer at least one removable transparent polymer film is present. When during use the solar cell unit according to the invention gets dirty or is damaged, so that the transparency of its surface is reduced to an unacceptable level, the top polymer film is simply removed, giving a fresh surface which is clean and undamaged. This process can be repeated as many times as there are removable transparent polymer films available.

In the context of the present specification the term top layer refers to a stable top layer, that is, a top layer of which the internal physical and chemical properties, e.g., the degree of polymerisation, are not capable of changing substantially during use.

The number of removable transparent polymer films is determined by the conditions in question. With a too high number of transparent polymer films, the quantity of light reaching the active layers of the solar cell unit through the transparent polymer films becomes too low. When the number of transparent polymer films is too low, the solar cell unit surface cannot be renewed often enough, as a result of which the effect of the invention is insufficiently achieved. Preferably, there are 2–10 removable transparent polymer films stacked one on top of the other on the top layer, more preferably 3–5 films. The number of removable transparent polymer films will also depend on the use to which the solar cell unit is ultimately put. In the case of solar cell units employed in highly polluting surroundings, e.g., alongside motorways, a higher number of removable transparent polymer films will be opted for than when the solar cell units are employed in less polluting surroundings.

Figure 2:
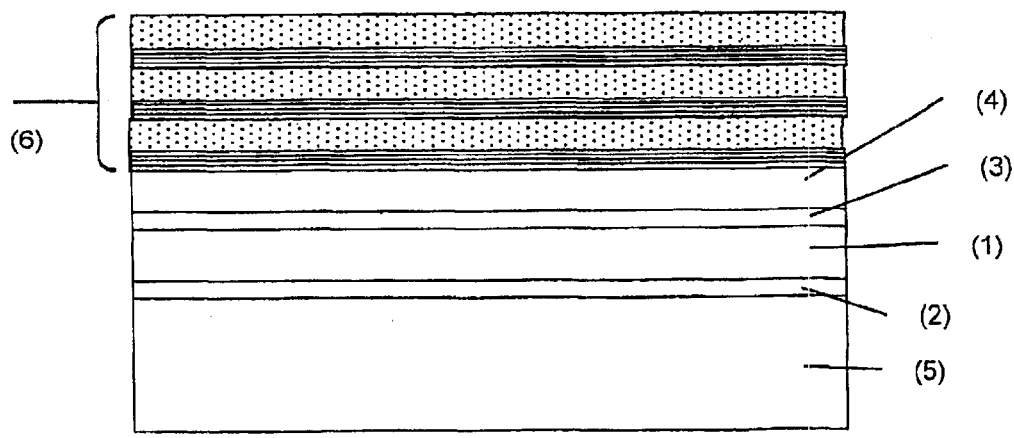

The Drawings further illustrate the present invention wherein:

FIG. 1 is a cross sectional view of a solar cell according to the prior art; and FIG. 2 is a cross sectional view of an embodiment of a solar cell according to the present invention.

The invention will be elucidated further with references to FIGS. 1 and 2. FIG. 1 shows a well-known solar cell unit wherein (1) represents a photovoltaic layer, (2) represents the back electrode, (3) represents the front electrode, and (4) is the transparent top layer based on, e.g., glass or plastic (5) stands for an optionally present substrate serving as a carrier or protective layer. FIG. 2 shows an example of a solar cell unit according to the invention, where on top of the solar cell unit of FIG. 1 a stack (6) of 3 removable transparent polymer films has been provided.

In the embodiment illustrated in FIG. 2, each polymer film is provided on the bottom side with an adhesive layer which displays greater adhesion to the polymer film itself than to the underlying layer, so that when the polymer film is removed, the adhesive layer is removed along with the film. Depending on the nature of the polymer film, e.g., its static properties, the presence of an adhesive layer is not always essential, however.

The present invention also pertains to a process for generating electricity using a solar cell unit of the present invention. In this process a solar cell unit according to the invention comprising a top layer and at least one removable transparent polymer film is exposed to the environment. When the transparency of the polymer film present at the top of the solar cell unit has decreased to an unacceptable level, e.g., by deposition of dirt, the top polymer film is removed, exposing the polymer film below it to the environment. When more than one polymer film is present, this step is repeated until all polymer films have been removed. Then, the top layer itself is exposed to the environment.

Suitable materials for the removable transparent polymer films are known as such. They comprise, int. al., films based on polyesters, polyamides, polyimides, polyether sulphones, polycarbonates, polyolefins, acrylates, and acetates.

Suitable examples include films of polyethylene, polypropylene, polyester, cellulose triacetate, polycarbonate, and polyamide. Polymer films provided with transparent barrier layers to counter hard UV rays and gases and liquids are also emcompassed by the invention, as are anti-fouling layers.

The polymer film generally has a thickness of 5 to 60 µm, preferably of 10 to 25 µm.

Needless to say, the adhesive, if present, has to be transparent. For the rest, use may be made of suitable types of adhesives known to the skilled person. In the present specification the term transparent has the meaning of lighttransmitting in the frequency range where light is converted into electric energy by the photovoltaic layer.

When selecting the material for the removable transparent polymer film and determining its thickness, the following should be taken into account. On the one hand, it is desired to keep the adsorption of light by the polymer films as low as possible, in order for the quantity of light reaching the active layers of the solar cell unit to remain as high as possible. On the other hand, the polymer film has to have such intrinsic strength as will enable its easy removal. Taking the above into account, the skilled person will be able to select a suitable removable transparent polymer film.

Depending on the size of the solar cell unit, it may be that the removable transparent polymer film will be composed of a number of adjacent sections. In that case it is preferred to ensure that in the several polymer films composed of a number of sections which are stacked one on top of the other, each film has its transitions between the various sections provided in different places from the transitions in the films situated immediately above and underneath it, this to prevent a number of films being removed at the same time.

The polymer films and any adhesive layers present can be provided on the solar cell unit in manners known to the skilled person, e.g., by laminating, brushing, etc. The nature of the solar cell unit which is provided according to the invention with at least one removable transparent polymer film is not critical.

The invention may be applied to rigid solar cell units, e.g., solar cell units where the top layer is composed of a sheet of glass. Examples of this are the well-known solar cell units based on crystalline silicon.

However, as was indicated earlier, the invention is especially attractive for use with solar cell units with a plastic top layer, since generally speaking such solar cell units suffer more from damage and fouling than solar cell units with a top layer made of glass do. Solar cell units with a plastic top layer comprise rigid solar cell units based on, e.g., a ceramic carrier, but especially flexible solar cell units based on a carrier of, e.g., metal or a plastic material. The invention is especially suited to be used in solar cell units made by means of a continuous process, more particularly, in flexible solar cell units made in a roll-to-roll process, e.g., as described in WO 98/13882 or WO 99/49483. Said publications are incorporated by reference into the present description as regards the process for manufacturing the flexible solar cell units and the materials used in said process.

As indicated above, a solar cell unit comprises a back electrode, a photovoltaic layer, and a front electrode, as well as a transparent top layer. Depending on the conditions, the solar cell unit will also comprise, at the back of the back electrode, a substrate serving as a carrier or protective layer. The nature of the carrier, the back electrode, the photovoltaic layer, and the front electrode is not critical to the present invention. The following description is offered merely by way of illustration.

The transparent top layer may be any well-known transparent top layer and comprises, e,g., a sheet of glass or a plastic sheet or film. The front electrode generally is a transparent conductive oxide (TCO). Suitable TCOs comprise indium tin oxide, zinc oxide, aluminium-, fluorine- or boron-doped zinc oxide, cadmium sulphide, cadmium oxide, tin oxide, and F-doped $SnO_2$.

The photovoltaic layer may comprise any suitable system known to the skilled person, e.g., amorphous silicon (a-Si:H), microcrystalline silicon, polycrystalline silicon, amorphous silicon carbide (a-SiC) and a-SiC:H, amorphous silicon-germanium (a-SiGe) and a-SiGe:H, a-SiSn:H, CIS (copper indium diselenide, $CuInSe_2$), cadmium telluride, Cu(In,Ga)Se, ZnSe/CIS, ZnO/CIS, Mo/CIS/CdS/ZnO, and dye-sensitised cells. Also, stacked cells of the aforesaid materials may be employed.

The back electrode, which depending on the use to which the solar cell unit is put may also serve as reflector, may be made up of, e.g., aluminium, silver or a combination of the two, optionally with an intermediate layer of a dielectric such as ZnO arranged between the metal layer and the photoactive semiconductor. Depending on the nature of the system, the substrate optionally present at the back of the back electrode may serve as a carrier or only have a protective function. If so desired, the substrate may be transparent when the solar cell unit has to be wholly or partially transparent. (In the latter case, the back electrode of course also should be wholly or partially transparent.) Suitable materials are determined by the function of the substrate. When the substrate has a carrier function, it may be, e.g., a rigid or flexible supporting material, such as a sheet or foil of plastic or metal. When the substrate primarily has a protective function, it may be, e.g., a thin plastic film.

What is claimed is:

1. A solar cell unit comprising a back electrode, a photovoltaic layer, a front electrode, and a transparent top layer, wherein on top of the top layer two to ten removable transparent polymer films, stacked one on top of the other, are present.

2. The solar cell unit of claim 1 wherein three to ten removable transparent polymer films, stacked one on top of the other, are present on the top layer.

3. The solar cell unit of claim 1 wherein three to five removable transparent polymer films, stacked one on top of the other, are present on the top layer.

4. The solar cell unit of any one of claims 1–3 wherein each of the transparent polymer films are provided at their respective bottom side with an adhesive that displays greater adhesion to the polymer film itself than to the underlying layer.

5. The solar cell unit of any one of claims 1–3 which is additionally provided with a substrate at the back of the back electrode.

6. A method for generating electricity using a solar cell unit comprising a back electrode, a photovoltaic layer, a front electrode, and a transparent top layer, and on top of the top layer a removable transparent polymer film, or a stack of removable transparent polymer films, wherein the transparent polymer film or the top film of the stack of removable transparent polymer films is exposed to the environment, wherein when the transparency of the polymer film present at the top of the solar cell unit has decreased to an unacceptable level, the polymer film or the top polymer film is removed, this step being repeated until all polymer films have been removed, where after the top layer itself is exposed to the environment.

7. A method for cleaning a solar call unit comprising a back electrode, a photovoltaic layer, a front electrode, and a transparent top layer, and on top of the top layer a removable transparent polymer film or a stack of removable transparent polymer films, comprising the step of removing the transparent polymer film er the top film of the stack of removable transparent polymer films when the transparency of the polymer film present at the top of the solar cull unit has decreased to an unacceptable level.

8. The solar cull unit of claim 4 which is additionally provided with a substrate at the back of the back electrode.

* * * * *

UNITED STATES PATENT AND TRADEMARK OFFICE
CERTIFICATE OF CORRECTION

PATENT NO. : 6,809,252 B2
DATED : October 26, 2004
INVENTOR(S) : Jan Winkeler

It is certified that error appears in the above-identified patent and that said Letters Patent is hereby corrected as shown below:

Column 4,
Line 60, change "er" to -- or --

Signed and Sealed this

Fourth Day of January, 2005

JON W. DUDAS
*Director of the United States Patent and Trademark Office*